(12) United States Patent
Reynaud et al.

(10) Patent No.: US 7,736,994 B2
(45) Date of Patent: Jun. 15, 2010

(54) METHOD FOR MANUFACTURING COMPOUND MATERIAL WAFERS AND CORRESPONDING COMPOUND MATERIAL WAFER

(75) Inventors: Patrick Reynaud, Saint Martin d'Heres (FR); Oleg Kononchuk, Grenoble (FR); Michael Stinco, Pont de Beauvoisin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 102 days.

(21) Appl. No.: 11/850,481

(22) Filed: Sep. 5, 2007

(65) Prior Publication Data

US 2008/0176380 A1 Jul. 24, 2008

(30) Foreign Application Priority Data

Jan. 24, 2007 (EP) .................................. 07290094

(51) Int. Cl.
*H01L 21/30* (2006.01)
(52) U.S. Cl. ..................... 438/455; 438/369; 438/370; 438/406; 257/E21.561; 257/E21.567; 257/E21.568
(58) Field of Classification Search ................ 438/369, 438/370, 403, 423, 765; 257/E21.087, E21.48
See application file for complete search history.

(56) References Cited

U.S. PATENT DOCUMENTS 5,953,622 A 9/1999 Lee et al. .................... 438/458
6,211,041 B1 4/2001 Ogura ........................ 438/458
6,284,628 B1 9/2001 Kuwahara et al. ............ 439/459
6,448,152 B1 9/2002 Henley et al. ................ 438/458
7,052,978 B2 5/2006 Shaheen et al. ............. 438/463
2002/0137265 A1 9/2002 Yamazaki et al. ........... 438/150

(Continued)

FOREIGN PATENT DOCUMENTS

EP 1 513 193 A1 3/2005

(Continued)

OTHER PUBLICATIONS

Hiroji Aga et al., XP-000823192, "Study of HF Defects in thin Bonded SOI Dependent on Original Wafers", pp. 304-305 (1998).

(Continued)

*Primary Examiner*—Charles D Garber
*Assistant Examiner*—Cheung Lee
(74) *Attorney, Agent, or Firm*—Winston & Strawn LLP

(57) ABSTRACT

The invention relates to a method for manufacturing compound material wafers, in particular, silicon on insulator type wafers, by providing an initial donor substrate, forming an insulating layer over the initial donor substrate, forming a predetermined splitting area in the initial donor substrate, attaching the initial donor substrate onto a handle substrate and detaching the donor substrate at the predetermined splitting area, thereby transferring a layer of the initial donor substrate onto the handle substrate to form a compound material wafer. In order to be able to reuse the donor substrate more often, the invention proposes to carry out the thermal treatment step to form the insulating layer at a temperature of less than 950° C., in particular, less than 900° C., and preferably at 850° C. The invention also relates to a silicon on insulator type wafer manufactured according to the inventive method.

18 Claims, 2 Drawing Sheets

U.S. PATENT DOCUMENTS

| | | | |
|---|---|---|---|
| 2003/0029957 A1 | 2/2003 | Smith et al. | 242/430 |
| 2004/0087109 A1 | 5/2004 | McCann et al. | 438/455 |
| 2004/0185638 A1* | 9/2004 | Kakizaki et al. | 438/406 |
| 2004/0248378 A1 | 12/2004 | Ghyselen et al. | 438/458 |
| 2005/0026394 A1 | 2/2005 | Letertre et al. | 438/459 |
| 2006/0110899 A1 | 5/2006 | Bourdelle et al. | 438/584 |
| 2006/0172508 A1 | 8/2006 | Maleville et al. | 438/459 |
| 2007/0117350 A1* | 5/2007 | Seacrist et al. | 438/459 |

FOREIGN PATENT DOCUMENTS

| | | |
|---|---|---|
| EP | 1 659 623 A1 | 5/2006 |
| EP | 0955 671 B1 | 12/2006 |
| FR | 2 855 909 | 12/2004 |
| FR | 2 881 573 | 8/2006 |
| JP | 10 114176 | 5/1998 |
| JP | 11-297583 | 10/1999 |

OTHER PUBLICATIONS

Copending U.S. Appl. No. 11/850,170, filed Sep. 5, 2007 and office Actions therein.

* cited by examiner

METHOD FOR MANUFACTURING COMPOUND MATERIAL WAFERS AND CORRESPONDING COMPOUND MATERIAL WAFER

BACKGROUND ART

The invention relates to a method for manufacturing compound material wafers, in particular silicon on insulator wafers, comprising the steps of: providing an initial donor substrate, forming an insulating layer over the initial donor substrate, forming a predetermined splitting area in the initial donor substrate, attaching the initial donor substrate onto a handle substrate, and detaching the donor substrate at the predetermined slitting are, thereby transferring a layer of the initial donor substrate onto the handle substrate to form a compound material wafer. The invention furthermore relates to a compound material wafer, in particular, a silicon on insulator wafer fabricated according to the previously mentioned method.

Compound material wafers, in particular the silicon on insulator (SOI) wafers, are semiconductor substrates which, in modern semiconductor devices, play a decisive role to ensure ever higher speed as smaller dimension are enabled. The process to fabricate such compound material wafers has, however, to satisfy at least two basic requirements. First, a good crystalline quality over essentially the entire surface of the wafer needs to be satisfied in the layered structure and, second the fabrication needs to be carried out without incurring excessive costs.

One way to satisfy the above mentioned requirements is the so called SMART-CUT® fabrication process in which a layer from a donor substrate is transferred onto a handle substrate. This is achieved by bonding the two substrates and detaching the donor substrate at a predetermined splitting area, which has previously been formed in the initial donor substrate. The predetermined splitting area is created beforehand by implanting atomic species, like hydrogen or rare gas ions into the donor substrate. This approach has the advantage that the donor substrate from which a layer is transferred from fabrication run to fabrication run, is reused several times. It appeared, however, that, from run to run, the crystalline quality of the transferred layer deteriorated. As a consequence a certain number of measures have been proposed to overcome this problem.

Japanese patent application JP 10114176 proposes additional process steps, like polishing the donor substrate, to remove the surface step at the edge of the wafer. This step is present after the transfer of a layer onto the handle substrate. Then a second finishing polishing step is carried out before the remainder of the donor substrate is reused as a as a new donor substrate in a subsequent fabrication run. US patent application 2003/029957 alternatively proposes, prior to polishing, additional heat treatment steps of the reclaimed donor wafer. It appeared, however, that even though improvements in the crystalline quality can be achieved by the additional process steps, the number of reuses still remained unsatisfactory low.

U.S. Pat. No. 6,211,041 does not deal with the reuse of donor substrates, but discloses an approach which consists in providing, right from the beginning, a silicon substrate with a low oxygen content preventing the creation of crystal defects. However, like for the other two methods, special additional steps are necessary beforehand to create the silicon substrate with reduced oxygen content and, in addition, the number of possible reuses of the donor substrate was still not satisfactory. Thus, improvements in these processes are necessary and desired.

SUMMARY OF THE INVENTION

In view of the abovementioned problem and the unsatisfactory known measures to overcome this problem, the present invention now provides a method for manufacturing compound material wafers which allows an increased number of reuses of the used donor substrate and, at the same time, allows the fabrication of good quality compound material wafers without the necessity of further additional treatment steps.

This method comprises the steps of providing an initial donor substrate, forming an insulating layer over the initial donor substrate by a thermal treatment carried out at a temperature of less than 950° C. to reduce HF defects in the donor substrate adjacent the insulating layer, forming a predetermined splitting area in the initial donor substrate, attaching the initial donor substrate onto a handle substrate, and detaching the donor substrate at the predetermined splitting area, thereby transferring a layer of the initial donor substrate onto the handle substrate to form a compound material wafer.

Surprisingly, it was found that the decisive step concerning the number of possible reuses of the donor substrate is the step of forming the insulating layer over the initial donor substrate. As already mentioned above, it is a key requirement in the fabrication process of compound material wafers to realize the advanced structure at reasonable costs. Therefore, the formation of the insulating layer was previously achieved using a thermal treatment that was carried out at high temperatures exceeding 1000° C. because those high temperatures provided an increased oxidation rate which resulted in a high throughput. The temperature was only limited by the difficulties to control thickness and uniformity over the surface of the wafer in case the oxidation rate was too high. The typical upper limit for the heat treatment was therefore set at about 1100° C. By choosing such high temperatures, the insulating layer was formed in about 15 minutes to 1 hour. Now according to the invention, the thermal treatment is carried out at lower temperatures, lower than 950° C., in particular, lower than 900° C. and preferably at about 850° C. or less, and by doing so not only the crystalline quality of the transferred layer can be kept high for an increased number of recycling runs, but in addition, the necessity of extensive additional steps, like those proposed in the state of the art, can be omitted. Using the inventive method a surface polishing step during reclaiming is all that is needed to remove surface irregularities that remain on the donor substrate after the transfer of the thin layer using the SMART-CUT® technology.

Preferably the present method can be repeated at least three times, preferable five to ten times wherein, the remainder of the initial donor substrate is reused as initial donor substrate in the subsequent manufacturing run. Due to the accumulation of the thermal treatment steps for forming the insulating layer during the manufacturing runs, a deterioration of the crystalline quality has to be expected from run to run. In particular, it is believed that repeated oxidation steps may induce the formation of oxygen precipitates and oxygen nuclei that result in defects in crystalline quality. Thus, even if during the first fabrication run, using a fresh donor substrate, the thermal treatment step to achieve the insulating layer could be carried out at the usual temperatures of about 1000° C. without too heavily influencing the crystalline quality of the transferred layer, this is no longer the case for the subsequent runs and, in particular, from the third run on it was necessary in the known prior art processes to specially retreat the remainder of the donor substrate to keep crystalline quality of the transferred layer sufficiently high. Therefore by applying the low temperature regime in case the fabrication process is repeated at least three times, in particular, five to ten times, the crystalline quality can be kept high without the necessity of tedious additional process steps to repair the remainder of the donor substrate.

The low temperature regime also allows to ease the fabrication of the initial fresh donor wafer, since it is possible to use donor wafers of reduced crystalline quality which can still be recycled at least three times. This is because the crystalline quality is less deteriorated by the low temperature oxidation process. This is particularly true for large diameter wafers, in particular for silicon wafers having diameters of 300 mm or more, for which it is more complex and costly to achieve the necessary crystalline quality enabling at least three recycling steps.

BRIEF DESCRIPTION OF THE DRAWINGS

Specific embodiments of the present invention will become more apparent from the present description with reference to the accompanying drawings, wherein.

DETAILED DESCRIPTION OF THE PREFERRED EMBODIMENTS

Figure 1:
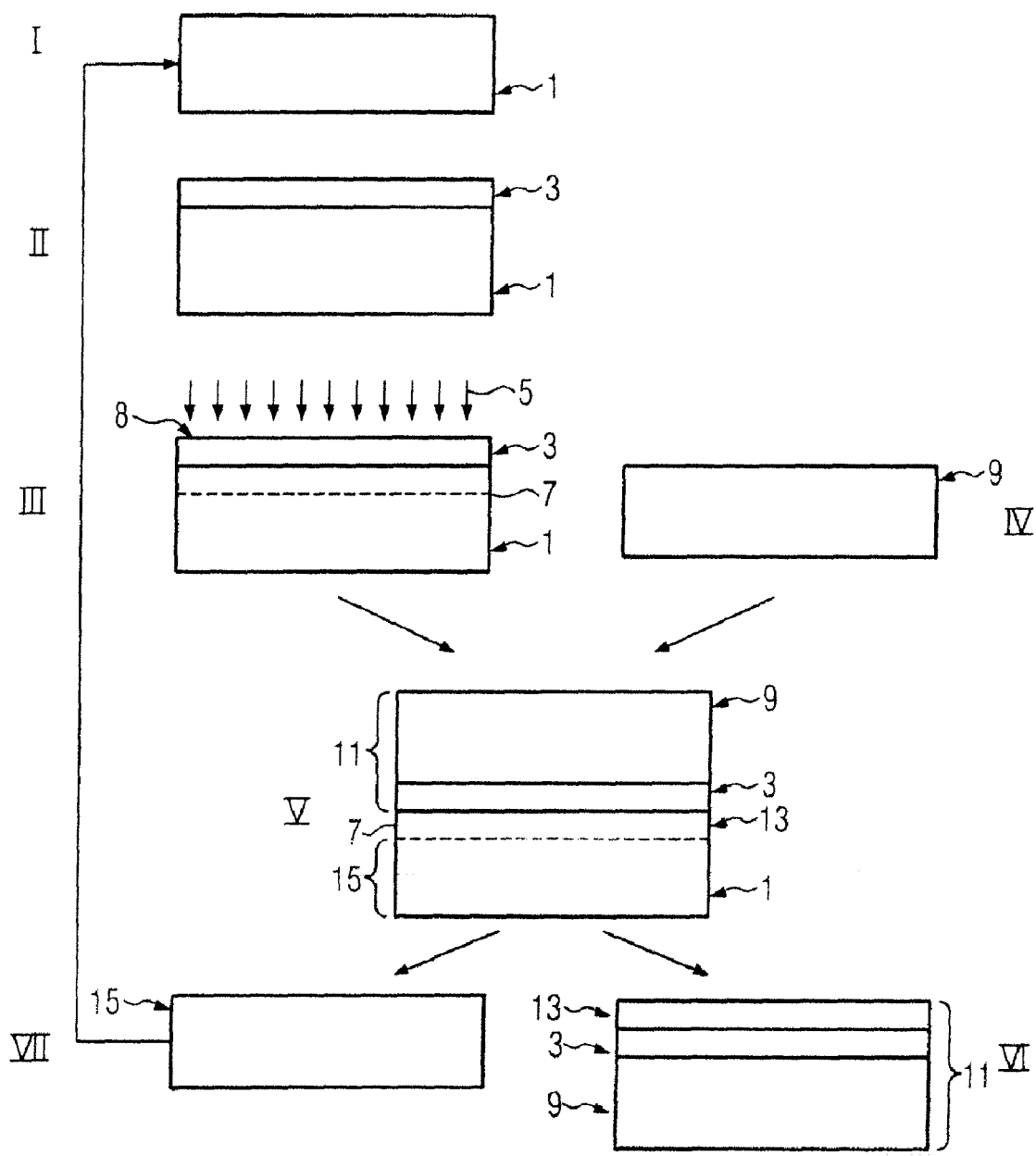
FIG. 1 illustrates one embodiment of the inventive method for manufacturing compound material wafers, and FIG. 2 illustrate HF defect maps of surfaces of examples of compound material wafers manufactured according to the inventive method compared to comparative examples.

According to a preferred embodiment, the transferred layer can have a thickness of 1000 Å or less. Typically the transferred layer is between 500 Å and 5000 Å, in particular 2500 Å or less. After transfer it is then thinned down to 1000 Å or less to form the final device layer. It has been observed that the defects are growing from one heat treatment process for forming the insulating layer to the other. As a consequence, this results in defect sizes comparable to the thickness of the device layer. Thus, in particular for thin device layers, 1000 Å of less, it becomes important to carefully choose the temperature of the thermal treatment step to form the insulating layer sufficiently low, so that even for thin transferred layers the donor substrate can be reused several times, preferably 5 to 10 times.

According to a variant the transferred layer is a thick layer, for instance with a thickness of 3000 Å to 7000 Å, and after the finishing steps like polishing and annealing. The finished layer is then further thickened by epitaxial deposition. It is for instance possible to manufacture "thick" SOI substrate formed of a device layer of silicon with a thickness of 6000 Å over a silicon oxide with a thickness of 3000 Å. In that case it is also important that the crystalline defects, like oxygen precipitates or nuclei of precipitation, are kept as small as possible, as the presence of too large defects in the finished layer may lead to the creation of defects, like stacking faults, in the further deposited epitaxial layer. Those defects may also grow during the finishing steps. By keeping crystalline defects in the transferred layer small, the further deposited layer can cover and bury those defects and reduce their detrimental influence in the final device layer.

Advantageously, the interstitial oxygen concentration in a fresh initial donor substrate prior to the first manufacturing run can be less than 25 old ppma, in particular less than 16 old ppma. Limiting the initial oxygen concentration to a minimum further reduced the advent of defects.

Preferably, the thermal treatment can be carried out such that the HF defect density of the transferred layer is less than 0.1 defects/cm$^2$, in particular, less than 0.05 defects/cm$^2$, in each manufacturing run using the initial donor substrate and its subsequent remainders. HF defects occur after dipping the compound material wafer in a HF solution edging away the oxide layer naturally formed on or in the transferred layer. Actually HF will form holes in the transferred layer at the crystalline defects. Depending on the size, the holes might extend through the transferred layer down to the buried insulating layer underneath. As these HF defects limit the use of the compound material wafers, it is mandatory to control their concentration. Depending on the accepted level of these HF defects, the thermal treatment steps to form the insulating layer can be adapted accordingly by choosing and controlling the corresponding insulating layer growth temperature, so that the desired defect density, for instance, less than 0.1 defects/cm$^2$ or even tighter less than 0.05 defects/cm$^2$, can be achieved.

According to a preferred embodiment, the insulating layer can be formed from manufacturing run to manufacturing run at a higher temperature. As already mentioned above, using a higher temperature has the advantage of a higher growth rate. It has been surprisingly found out, that the growth rate of the size of the defects goes down from run to run, so that in case one wants to increase throughput it becomes possible to raise the temperature of the thermal treatment step from run to run or at least for the last one or two runs.

Advantageously, the initial donor substrate can be a silicon wafer and the insulating layer, a silicon dioxide layer. In particular for this material choice, the impact of the temperature during the thermal treatment step for forming the insulating layer is crucial for the final product quality.

Preferably the thickness of the insulating layer can be at least 1000 Å, in particular, about 1450 Å. As with the reduced temperature during the insulating layer forming process step, the crystalline quality can be controlled, it is now possible to provide thick insulating layers and still keep crystalline quality of the transferred layer even after a third, fifth or tenth run using the same donor substrate, at a suitable level.

The invention furthermore also relates to a compound material wafer according to the features of claim 10. As the underlying fabrication process can be controlled with respect to the HF defects it becomes possible to provide compound material wafers from reclaimed donor substrates with HF defect densities of less than 0.1 defects/cm$^2$, in particular, less than 0.05 defects/cm$^2$.

The invention also relates to a reused donor substrate achieved in carrying out the method as described above.

FIG. 1 illustrates one embodiment of the inventive method of manufacturing compound material wafers. The method will be described for a silicon on insulator (SOI) type compound material wafer. This material choice, however, only represents one possible realisation, nevertheless, the inventive method is applicable to other types of material compound wafers.

A first step of the inventive method is to provide an initial donor substrate 1, in this embodiment a silicon wafer. Step II is a step of forming an insulating layer 3 on the silicon wafer 1. According to this embodiment, the insulating layer 3 is a silicon oxide layer (SiO$_2$) which is formed by a thermal treatment under oxidising conditions.

In Step III, atomic species 5, in particular, hydrogen alone or preferably in combination with a rare gas ion, typically helium, are implanted under predetermined dose and energy conditions through the insulating layer 3 to create a predetermined splitting area 7 inside the donor substrate 1. As can be seen, this predetermined splitting area is essentially parallel to the main surface 8 of substrate 1. Eventually, implanting using one species is accompanied by a second implantation of a different species, wherein the first species may be helium and the second species hydrogen.

Step IV consists in providing a handle or receiver substrate 9, for instance, another silicon wafer.

In the subsequent step, Step V, the donor substrate 1 together with its insulating layer 3 is bonded to the handle substrate 9 typically by molecular bonding. Bonding occurs such that the insulating layer 3 is sandwiched between the donor substrate 1 and the handle substrate 9. Next, a detachment treatment is carried out during which detachment occurs at the predetermined splitting area 7, such that a silicon on insulator wafer 11 is created. The detachment treatment is preferably a heat treatment, due to which, detachment occurs.

Step VI illustrates the silicon on insulator wafer 11 which comprises the handle substrate, the insulating layer 3 and the transferred layer 13 which originated from the donor substrate 1. The remainder 15 of the donor substrate 1, illustrated in Step VII, can then be reused as a new donor substrate 1 in Step I. Prior to the reuse, the remainder 15 of the donor substrate 1 undergoes a certain number of recycling steps usually consisting in polishing and/or cleaning, as conventionally known in the prior art. Once transferred, the transferred layer 13 can be treated to reduce its thickness to the final desired thickness and to improve its surface roughness. This finishing operation comprises for instance annealing steps.

In the prior art, it was not possible to reuse the donor substrate without extensive additional steps to get rid of or reduce the oxygen precipitates to a tolerable level. Reuse was possible for manufacturing thick device layers, with thicknesses larger than the size of the defects, but was limited to two or three times, beyond that too many defects were observed in the final SOI products, in particular for wafers with large diameters, in particular diameters of 300 mm or more, for which it is difficult and costly to obtain sufficient crystalline quality for allowing recycling of the donor wafers of at least 3 times.

It was surprisingly found out, that the decisive step concerning an improvement of the above described situation, is step II, the step of forming the insulating layer 3 over the donor substrate 1. To keep the throughput of the SOI wafer production at a satisfactory high level and to allow sufficiently thick insulating layers 3, the thermal treatment step to create the insulating layer 3 was carried out at temperatures close to 1000° C. or exceeding it. Now, according to the invention, this step is carried out at lower temperatures, less than 950° C., in particular less than 900° C., preferably at 850° C. or less, as the result of which a decrease in HF defects compared to the conventional method was observed, however with a negative effect of increasing the layer formation time. HF defects occur when the SOI wafer 11 is dipped into an HF solution which etches away the naturally grown silicon dioxide layer and which leads to holes at positions of oxygen precipitates. But, one donor substrate 1 can now be reused at least three times, and in particular five to ten times. Furthermore, no further oxygen precipitates reducing or eliminating steps, like in the prior art, are necessary. This counterweights the negative impact of the longer layer formation times. A lower limit to avoid excessively long layer formation times is 750° C.

The achievement of the invention, namely, that it is now possible to carry out the compound material wafer manufacturing process such that the negative impact of oxygen precipitates leading to HF defects can be limited, brings the further advantages that transferred layers 13 of reduced thicknesses can be provided. In particular it becomes possible to prepare transferred layers 13 which after thinning lead to device layers with a thickness of less than 1000 nm even from donor substrates 1 which are reused for the third, fifth or even tenth time. Due to the same reason, it is also possible to provide insulating layers 3 with large thicknesses without creating a number of defects in the transferred layer which would render the SOI wafer 11 unusable. In particular, insulating layers 3 with a thickness of at least 1000 Å, in particular, with a thickness of about 1450 Å can be grown.

In the abovementioned embodiment according to the invention, the thermal treatment step to form the insulating layer 3 is preferable carried out at the same temperature in each run. However, according to a variant, it is also possible to adapt the temperature during each manufacturing run, in particular, to raise the temperature from run to run, as it was observed that the growth rate of the size of the oxygen precipitates lowers from run to run.

Figure 2:
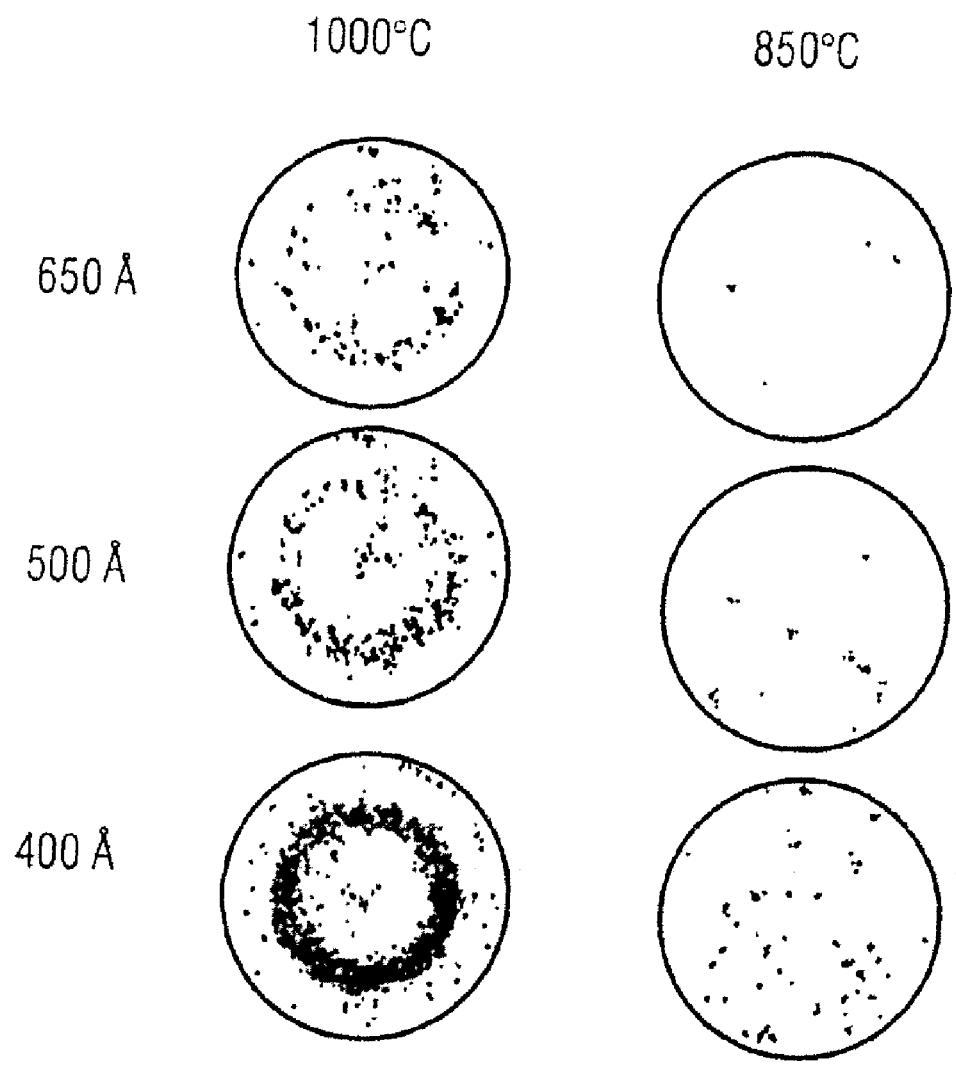

Using the abovementioned inventive method, a number of SOI wafer examples were prepared and their HF defect density compared to wafers fabricated according to the prior art process (comparative examples). The result of this comparison is illustrated in FIG. 2.

The examples according to the invention were fabricated using a donor wafer with 16 old ppma interstitial oxygen concentration and were oxidized at 850° C. to form a 1450 Å thick silicon dioxide layer. Ion implantation was carried out with hydrogen or a mixture of helium and hydrogen at a dose of about $10^{16}$ to $5 \times 10^{16}$ atoms/cm$^2$ at an energy of about 10 to 100 keV. The silicon donor wafers were then bonded to a handle substrate and heated to a temperature of about 500° C. for about two hours, to split the donor-handle compound at the predetermined splitting area formed by the implanted hydrogen or helium species. Depending on the implantation energy, the transferred layer 13 had a thickness of about 1000 Å to 3000 Å. Subsequently the remainder of the donor substrate 15 was polished to remove the edge step, which is inherent to the SMART-CUT® process, and to planarize the surface.

The described steps were then repeated 6 times and the resulting SOI wafer, thus, the seventh SOI wafer 11 was subjected to a thinning process to obtain a transferred layer thickness 13 of 650 Å. A second example was prepared in the same way with a transferred layer 13 thickness of 500 Å and a third example was prepared in the same way but thinned to a transferred layer 13 thickness of 400 Å.

Afterwards the three examples were subjected to a HF defects measurement.

The comparative examples were fabricated in the same way, with the only exception that the silicon dioxide layer formation process was carried out at 1000° C.

FIG. 2 now illustrates the results that were achieved after the HF treatment. FIG. 2 illustrates the surface of the transferred layers and, as can be seen, there is a clear improvement concerning HF defects for SOI wafers for which the oxygen layer has been formed at low temperatures (850° C.).

Even for the very thin final device layers, the inventive method allows the repetitive use of the donor substrate, in particular, allows to use the donor substrate as least three times, more in particular five to ten times. The number of reuses is then only limited by the remaining thickness of the reused donor substrate, which shall of course be sufficient to still ensure the mechanical stability of the donor substrate.

What is claimed is:

1. A method for reusing a donor substrate for manufacturing compound material wafers by a layer transfer method wherein the transfer layer has reduced HF defects than conventional layer transfer methods, which comprises the steps of:
   providing an initial donor substrate that includes oxygen precipitates or nuclei thereof,
   forming an insulating layer over the initial donor substrate by a thermal treatment carried out at a temperature of less than 950° C. to limit growth of the oxygen precipitates and thus reduce HF defects in the donor substrate adjacent the insulating layer,
   forming a predetermined splitting area in the initial donor substrate beneath the insulating layer,
   attaching the initial donor substrate onto a handle substrate,
   detaching the donor substrate at the predetermined splitting area, thereby transferring a layer of the initial donor substrate onto the handle substrate to form a compound material wafer wherein the transfer layer has an HF defect density of less than 0.1 defects/cm$^2$; and
   repeating the steps at least three to 10 times, while maintaining the defect density of the donor substrate at less than 0.1 defects/cm$^2$, with the remainder of the initial donor substrate after a detaching step being provided as the initial donor substrate for the next repeat of the steps.

2. The method of claim 1, wherein the compound material wafer is a silicon on insulator wafer and the insulating layer is formed at a temperature of less than 900° C.

3. The method of claim 2, wherein the insulating layer is formed at a temperature of about 850° C.

4. The method of claim 1, wherein the transferred layer has a thickness of 1000 Å or less.

5. The method of claim 1, wherein the initial donor substrate is a silicon wafer and the insulating layer is a silicon dioxide layer.

6. The method of claim 5, wherein the initial donor substrate has an interstitial oxygen concentration of less than 25 old ppma.

7. The method of claim 5, wherein the initial donor substrate has an interstitial oxygen concentration of less than 16 old ppma.

8. The method of claim 1, wherein the insulating layer has a thickness of least 1000 Å.

9. The method of claim 1, wherein the insulating layer has a thickness of least 1450 Å.

10. The method of claim 1, wherein the HF defect density in the transfer layer is less than 0.05 defects/cm$^2$.

11. A method for manufacturing compound material wafers by a layer transfer method wherein the transfer layer has reduced HF defects than conventional layer transfer methods, which comprises the steps of:
    providing an initial donor substrate;
    forming an insulating layer over the initial donor substrate by a thermal treatment carried out at a temperature of less than 950° C. to reduce HF defects in the donor substrate adjacent the insulating layer;
    forming a predetermined splitting area in the initial donor substrate beneath the insulating layer;
    attaching the initial donor substrate onto a handle substrate;
    detaching the donor substrate at the predetermined splitting area, thereby transferring a layer of the initial donor substrate onto the handle substrate to form a compound material wafer; and
    conducting at least one finishing step of polishing or annealing on the transferred layer and then thickening the transferred layer by epitaxial deposition to achieve a layer thickness of at least 6000 Å.

12. The method of claim 11, wherein the HF defect density in the transfer layer prior to epitaxial deposition is less than 0.1 defects/cm$^2$.

13. The method of claim 12, wherein the HF defect density in the transfer layer is less than 0.05 defects/cm$^2$.

14. The method of claim 11, wherein the initial donor substrate is a silicon wafer and the insulating layer is a silicon dioxide layer, the insulating layer has a thickness of least 1000 Å to 1450 Å, and the thermal treatment is carried out at a temperature of about 850 to 900° C.

15. A method for manufacturing compound material wafers by a layer transfer method wherein the transfer layer has reduced HF defects than conventional layer transfer methods, which comprises the steps of:
    providing an initial donor substrate;
    forming an insulating layer over the initial donor substrate by a thermal treatment carried out at a temperature of less than 950° C. to reduce HF defects in the donor substrate adjacent the insulating layer;
    forming a predetermined splitting area in the initial donor substrate beneath the insulating layer;
    attaching the initial donor substrate onto a handle substrate;
    detaching the donor substrate at the predetermined splitting area, thereby transferring a layer of the initial donor substrate onto the handle substrate to form a compound material wafer;
    repeating the steps at least three to 10 times, with the remainder of the initial donor substrate after a detaching step being provided as the initial donor substrate for the next repeat of the steps; and
    forming the insulator layer at a higher temperature each time the forming step is repeated.

16. The method of claim 15, wherein the transfer layer has an HF defect density of less than 0.1 defects/cm$^2$; and which further comprises maintaining the defect density of the donor substrate at less than 0.1 defects/cm$^2$ for subsequent layer transfers.

17. The method of claim 16, wherein the HF defect density in the transfer layer is less than 0.05 defects/cm$^2$.

18. The method of claim 15, wherein the initial donor substrate is a silicon wafer and the insulating layer is a silicon dioxide layer, the insulating layer has a thickness of least 1000 Å to 1450 Å, and the thermal treatment is carried out at a temperature of about 850 to 900° C.

* * * * *